United States Patent
Qian

(10) Patent No.: US 7,983,648 B2
(45) Date of Patent: Jul. 19, 2011

(54) LOW INTERMEDIATE FREQUENCY RECEIVER AND THE SAME METHOD THEREOF

(75) Inventor: Xuecheng Qian, Shanghai (CN)

(73) Assignee: ST-Ericsson SA, Geneva (CH)

( * ) Notice: Subject to any disclaimer, the term of this patent is extended or adjusted under 35 U.S.C. 154(b) by 861 days.

(21) Appl. No.: 11/813,993

(22) PCT Filed: Jan. 10, 2006

(86) PCT No.: PCT/IB2006/050081
§ 371 (c)(1),
(2), (4) Date: Jul. 13, 2007

(87) PCT Pub. No.: WO2006/075285
PCT Pub. Date: Jul. 20, 2006

(65) Prior Publication Data
US 2008/0207157 A1  Aug. 28, 2008

(30) Foreign Application Priority Data
Jan. 13, 2005 (CN) .......................... 2005 1 0004749

(51) Int. Cl.
*H04B 1/26* (2006.01)

(52) U.S. Cl. ........ 455/323; 455/307; 455/339; 455/296; 455/309; 455/311; 375/332; 375/329; 375/334

(58) Field of Classification Search .................. 455/323, 455/307, 339, 296, 309, 311; 375/332, 329, 375/334
See application file for complete search history.

(56) References Cited

U.S. PATENT DOCUMENTS

| | | | | |
|---|---|---|---|---|
| 5,454,007 A * | 9/1995 | Dutta | ............................. | 375/322 |
| 6,215,828 B1 * | 4/2001 | Signell et al. | ................. | 375/316 |
| 6,243,430 B1 | 6/2001 | Mathe | | |
| 6,308,057 B1 | 10/2001 | Hayashi | | |
| 6,904,104 B1 * | 6/2005 | Khullar et al. | ................. | 375/332 |
| 2002/0090924 A1 | 7/2002 | Suominen | | |

FOREIGN PATENT DOCUMENTS

| | | |
|---|---|---|
| CN | 1300467 A | 6/2001 |
| JP | 11-205403 | 7/1999 |
| JP | 2001508249 T | 6/2001 |
| WO | WO 98/15083 A2 | 4/1998 |
| WO | WO 99/35746 A1 | 7/1999 |

OTHER PUBLICATIONS

Makowitz, R; et al "First if Sampling Techniques for DVB-T Receivers" Devices, Circuits and Systems, 2000. Proceedings of the 2000 Third IEEE International Caracas Conference, Mar. 15, 2000, pp. 451-454.

* cited by examiner

*Primary Examiner* — Sanh D Phu

(57) ABSTRACT

The present invention provides a low intermediate frequency receiver for receiving radio frequency signal and provides the sampling method thereof. The low intermediate frequency receiver firstly samples the radio frequency signal so as to convert it into digital signal of non-zero frequency domain. Secondly it compensates the digital signal of non-zero frequency domain to filter out the interfering signal therein. Finally, the compensated digital signal is frequency-shifted to the zero frequency domain. By using the low intermediate frequency receiver and the sampling method thereof according to the present invention, the interference at the zero frequency, like DC drift and intermodulation component, could be easily filtered out without imposing any great influence on the useful signals.

20 Claims, 4 Drawing Sheets

LOW INTERMEDIATE FREQUENCY RECEIVER AND THE SAME METHOD THEREOF

FIELD OF THE INVENTION

The present invention relates to a radio signal receiver used in radio communication, in particular, to a low intermediate frequency receiver and a sampling method thereof.

BACKGROUND OF THE INVENTION

Recently, a novel architecture of receiver is being used increasing popular in the radio communication field. The basic design concept of such receiver architecture is to make analog to digital converters (ADC) close to radio frequency (RF) receiving antennas as much as possible so as to perform analog to digital conversion directly on the radio frequency signal, and then programmable digital signal processing units process received signals. Owing to the characteristics of flexibility, low cost and easy to integrate of digital signal processing, such method is applicable for many kinds of communication protocol, and thus facilitates technical upgrading.

Nevertheless, the above-mentioned type of receiver will be taken herein as an example to illustrate the problems such receiver is encountering.

Firstly, a user signal (with the bandwidth of B) is represented by two orthogonal components, that is, I(t)+jQ(t), then the radio frequency signal with the carrier frequency of $f_c$ which is orthogonally modulated by the user signal could be represented as:

$$S(t)=I(t)\cos(\omega_c t+\phi)-Q(t)\sin(\omega_c t+\phi) \quad (1)$$

Wherein $\omega_c=2\pi f_c$, representing the circular frequency of the carrier, and $\phi$ is the initial phase of the carrier.

S(t) could be further represented by two band-pass components S'(t) and S"(t) whose central frequencies are $f_c$ and $-f_c$, respectively:

$$S'(t) = \frac{1}{2}\{[I(t)\cos(\varphi) - Q(t)\sin(\varphi)] + j[I(t)\sin(\varphi) + Q(t)\cos(\varphi)]\}e^{j w_c t} \quad (2)$$

$$S''(t) = \frac{1}{2}\{[I(t)\cos(\varphi) - Q(t)\sin(\varphi)] - j[I(t)\sin(\varphi) + Q(t)\cos(\varphi)]\}e^{-j w_c t} \quad (3)$$

The frequency spectrum characteristics thereof are as shown in FIG. 1, and it can be seen that the signal bandwidths of S'(t) and S"(t) are completely the same.

To avoid frequency spectrum aliasing when performing band-pass sampling on the radio frequency signal, a clock signal with the frequency of $$f_s = \frac{f_c}{N} > B$$

could be selected, and the sampled signal frequency spectrum is equivalent to that the original RF signal frequency spectrum (as shown in FIG. 1) periodically extended in the frequency spectrum domain, taking the sampling frequency $f_s$ as the period, as shown in FIG. 2.

It can be seen from FIG. 2 that when the frequency spectrum is periodically extended, the high order frequency spectrum components of S'(t) and S"(t) are superposed with each other at frequencies which are integral multiple of the sampling frequency. Therefore, there is a superposed frequency component with the bandwidth of B at the zero frequency, for baseband signal processing subsequently. The time domain representation of the signal having the zero frequency as its center (i.e., the carrier frequency thereof is zero) could be calculated from equations (2) and (3), that is, I(t)cos($\phi$)−Q(t)sin($\phi$). Due to the frequency spectrum aliasing, the zero carrier signal is in fact a linear combination of the orthogonal user signals I(t) and Q(t).

In order to separate the orthogonal user signals I(t) and Q(t), two clock signals having the same frequency but different phases are used to perform two-path band-pass sampling on the RF signal, thereby to obtain the linear combination of two orthogonal user signals that are different from each other, then the I(t) and Q(t) of the user signal could be obtained through separation process.

According to the above principle, a solution is put forward in the Chinese application for patent for invention titled "Band-pass sampling receiver and the sampling method thereof" with the number of 200310122502.3 filed by the applicant of Koninklijke Philips Electronics N. V. on Dec. 5, 2003, and the contents disclosed in this application will be introduced herein by insertion. The architecture of the band-pass sampling receiver provided by this patent application is as shown in FIG. 3, wherein the sampling clock frequencies of two ADC 710 and 711 are both 1/N of the carrier frequency of the RF signal, but there is a fixed relative time delay $\tau$ between two sampling clocks $CLK_1$ and $CLK_2$, while $$\tau << \frac{1}{B},$$

thus making the sampling points of the two paths of clock signals to have different carrier phases. Therefore, two different digital sequences are obtained after analog to digital conversion. Necessary digital signal processing is performed so as to separate the two orthogonal components and recover the desired user signal subsequently.

The above solution is an effective sub-sampling solution under ideal conditions owing to its relatively low sampling frequency and putting main signal processing on the more flexible digital domain.

However, under some circumstances, there will be stronger DC drift and intermodulation component caused by non-ideal circuits, and such interference is usually hard to accept and need to be removed by filters or by compensation algorithm. For communication systems like IS-95, CDMA2000 and UMTS systems, energy of the useful signal thereof is distributed in a broad frequency domain, while the interference of DC drift and intermodulation component, etc., are within a narrow frequency domain near the zero frequency, in which energy of the signal takes only a very small share of the total signal energy, thus the interference could be filtered out through the digital high-pass filter without imposing great influence on the performance of the useful signal. However, for the communication systems such as GSM and Bluetooth, since energy of the useful signal thereof is mainly concentrated in a narrow range near the zero frequency domain, a lot of useful signals will be lost when filtering the interference near the zero frequency domain through the digital high-pass filter; so such method is not suitable for the zero intermediate frequency band-pass sampling receiver.

Therefore, it becomes a pending problem as to how to improve the structure of the existing receiver and the sampling method thereof so as to effectively filter out the interference of DC drift and intermodulation component, etc., and thus to make it applicable to more kinds of communication systems.

OBJECT AND SUMMARY OF THE INVENTION

The object of the present invention is to provide a low intermediate frequency receiver and a sampling method thereof, which could effectively filter out interference of DC drift and intermodulation component, etc., without imposing any great influence on the useful signals.

In order to achieve the above-mentioned object, a sampling method of low intermediate frequency receiver provided according to the present invention comprising the steps of (a) sampling the radio frequency signal to convert it into digital signal of non-zero frequency domain;

(b) compensating the digital signal of non-zero frequency domain to filter out interfering signals therein; and (c) shifting the compensated digital signal to the zero frequency domain.

In order to achieve the above-mentioned object, a low intermediate frequency receiver provided according to the present invention comprises an analog to digital converting means, a compensating means and a mixing means, wherein the analog to digital converting means is used for sampling the radio frequency signal to convert it into digital signal of non-zero frequency domain. The compensating means is used for compensating the digital signal of non-zero frequency domain to filter out the interfering signals therein; and the mixing means is used for shifting the compensated digital signal to the zero frequency domain.

By using the above-mentioned low intermediate frequency receiver and the sampling method thereof according to the present invention, the non-zero frequency sampling signal will be obtained first, for which the interference of DC drift and intermodulation component, etc., at the zero frequency could be easily filtered out without imposing any great influence on the useful signals. Therefore, the low intermediate frequency receiver and the sampling method thereof according to the present invention could not only be applied to communication systems like IS-95, CDMA2000 and UMTS, but also be applied to the communication systems of the types of GSM and Bluetooth, etc.

Other objects and implementations together with more comprehensive understanding of the invention will become apparent and easy to understand by referring to the following description and claims taken in conjunction with the accompanying drawings.

BRIEF DESCRIPTION OF THE DRAWINGS

The present invention will be described in the following text in combination with the figures, wherein.

Among all the figures, the same reference signs indicate the similar or corresponding features or functions.

DETAILED DESCRIPTION OF THE INVENTION

In order to clearly describe the present invention, the designing principle of the sampling method of the low intermediate frequency receiver of the present invention will first be described and analyzed in connection with FIGS. 4, 5 and 6, and then the structural features of one specific embodiment of the low intermediate frequency receiver according to the present invention will be introduced in connection with FIG. 7.

Figure 1:
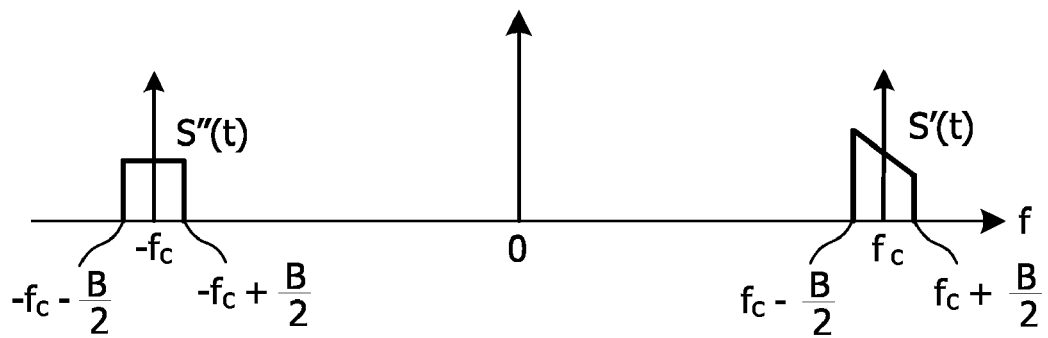
FIG. 1 is the frequency spectrum graph of the modulated radio frequency signal.
Figure 2:
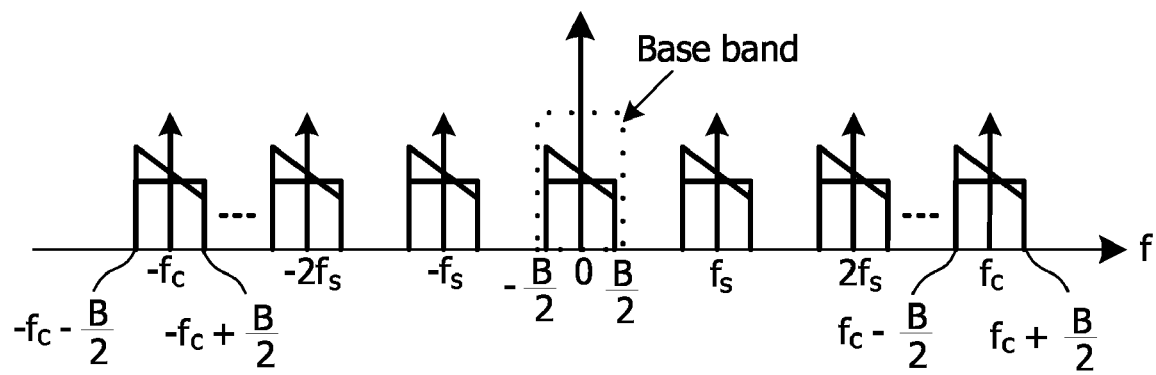
FIG. 2 is the frequency spectrum graph of the radio frequency signal having been sampled by the clock signal at the frequency of $$f_s = \frac{f_c}{N};$$
Figure 3:
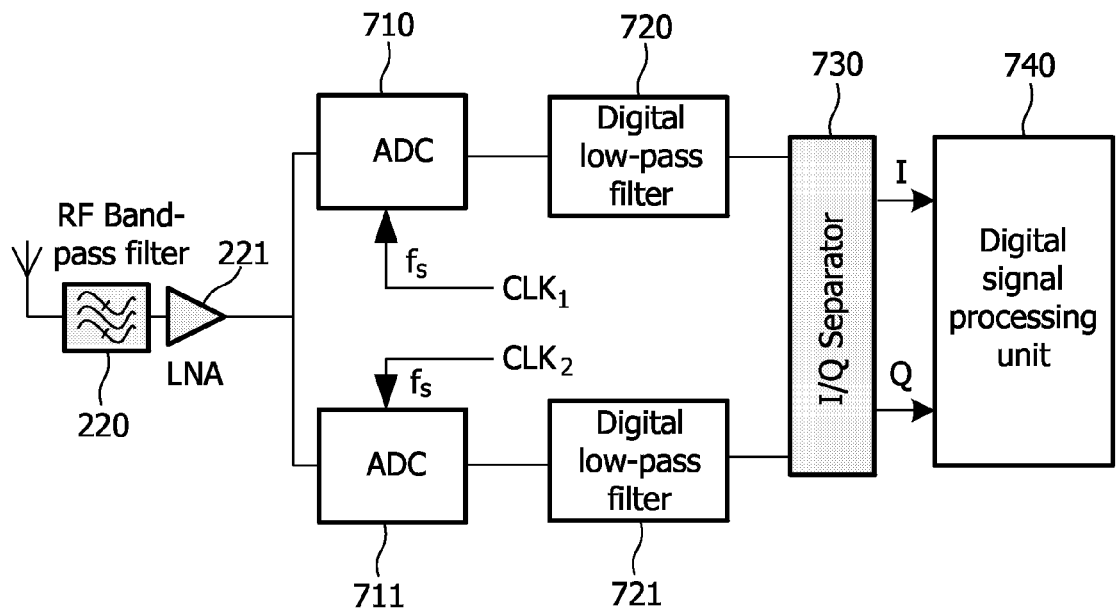
FIG. 3 is an architectural figure of a band-pass sampling receiver.
Figure 4:
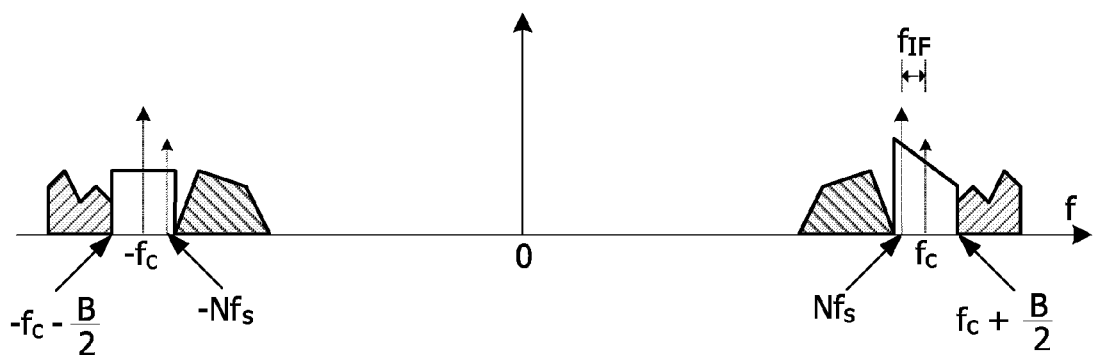
FIG. 4 is the frequency spectrum graph of the modulated radio frequency signal and the outband interfering signal.

FIG. 4 is the frequency spectrum graph of the modulated radio frequency signal and the outband interfering signal (shaded portion). If the band-pass sampling receiver as shown in FIG. 3 is used to process the received radio frequency signal, the obtained sampled useful signal will be within a narrow range centered at the zero frequency, in this circumstance, the interference of DC drift or intermodulation component, etc., existing at the zero frequency will be difficult to be filtered out.

Therefore, the concept of design of the present invention is to obtain the sampling signal of non-zero frequency first, and then after filtering out interference of DC drift or intermodulation component, etc., at the zero frequency, the useful signal will be shifted back to the zero frequency, and the specific method is as follows:

Firstly, performing analog to digital conversion on the received radio frequency signal in two paths, and two sampling clocks $CLK_1$ and $CLK_2$ are selected at this time, wherein the sampling frequencies of both of these two sampling clocks $CLK_1$ and $CLK_2$ are $f_s$. The relationship between the sampling frequency $f_s$ and the signal carrier frequency $f_c$ is $f_c = Nf_s \pm f_{IF}$, i.e., $$f_s = \frac{f_c \pm f_{IF}}{N},$$

wherein $f_{IF}$ is a lower intermediate frequency value, and $0 \leq f_{IF} < f_s$. N is a natural number and should be selected to make $f_s$ high enough, so that the frequency spectrum of useful signal is ensured not to be aliased by the frequency spectrum of interfering signal after sampling.

There is a fixed relative time delay $\tau$ between two sampling clocks $CLK_1$ and $CLK_2$ so as to obtain two digital sequences with different phases; and in order to keep the in-phase component I(t) and the orthogonal component Q(t) substantially unchanged during the time interval $\tau$, the condition of $\tau \ll 1/B$ should be met.

Figure 5:
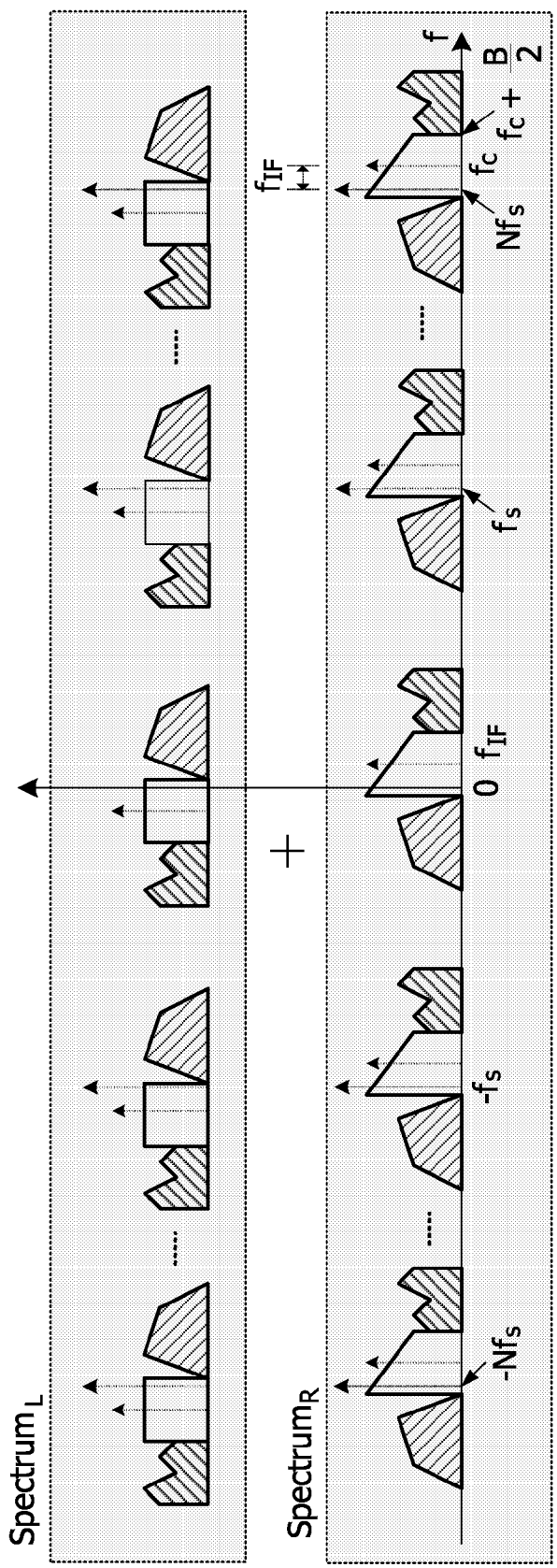
FIG. 5 is the frequency spectrum graph of the radio frequency signal having been sampled by the clock signal at the frequency of $$f_s = \frac{f_c \pm f_{IF}}{N};$$

The frequency spectrum graph of each path of sampled signal is as shown in FIG. 5, wherein the frequency spectrum of each path of sampled signal is a superposition of the periodically extended frequency spectrum (Spectrum$_L$) of the radio frequency signal of the original negative frequency domain and the frequency spectrum (Spectrum$_R$) of the radio frequency signal of the original positive frequency domain. For a clearer view, the figure separated the two parts of frequency spectrum. It could be seen from FIG. 5 that the center of the sampled useful signal is at the position of $\pm f_{IF}$, so some conventional DC compensation methods, such as high-pass filter, could be adopted to filter out interference of DC drift and intermodulation component, etc., at the zero frequency. Since the energy of useful signal at this time is not concentrated at the zero frequency, filtering at the zero frequency will not impose any great influence on the useful signal.

Subsequently, an I/Q separation will be performed on the DC compensated signal. At this time, the initial phases $\phi_1$ and $\phi_2$ of the radio frequency signal with respect to the two sampling clocks CLK$_1$ and CLK$_2$, respectively could be determined first, then the received signal will be processed on the basis of the determined $\phi_1$ and $\phi_2$ to calculate the two orthogonal components I(t) and Q(t) of the user signal. Wherein the phase difference of $\phi_1$ and $\phi_2$ should satisfy $\Delta\phi=\phi_2-\phi_1=Nf_s\tau\neq n\pi$. In addition, in order to further simplify the I/O separation process, a preferably alternative is to make $$\Delta\varphi = \left(n + \frac{1}{2}\right)\pi.$$

The specific algorithm for the above I/Q separation process is described in detail in the patent application 200310122502.3, so it will not be elaborated herein.

Figure 6:
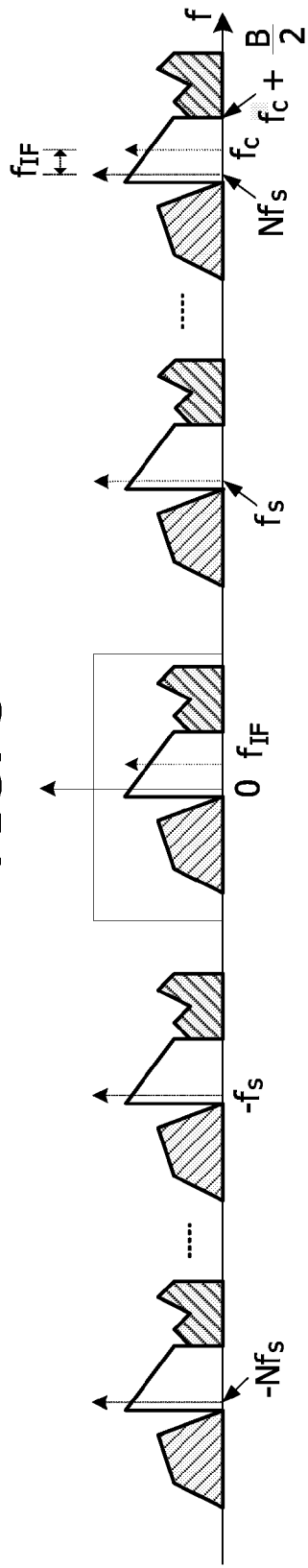
FIG. 6 is the frequency spectrum graph of the orthogonal radio frequency signal after the I/Q separation.

FIG. 6 is the frequency spectrum graph of the orthogonal signal of I path and Q path after the I/Q separation. It can be seen that the frequency spectrum of useful signal is separated from the frequency spectrum of the outband interfering signal, so the outband interfering signal could be easily filtered out in the subsequent digital signal processing. Moreover, a coarse filtering could be performed before the I/Q separation so as to lower the requirements on the index of the filter after the I/Q separation.

Finally, the orthogonal signals through the I/Q separation will be respectively mixed, then the center of the useful signal will be shifted to the zero frequency for the subsequent base band digital signal processing to recover the user signal.

Figure 7:
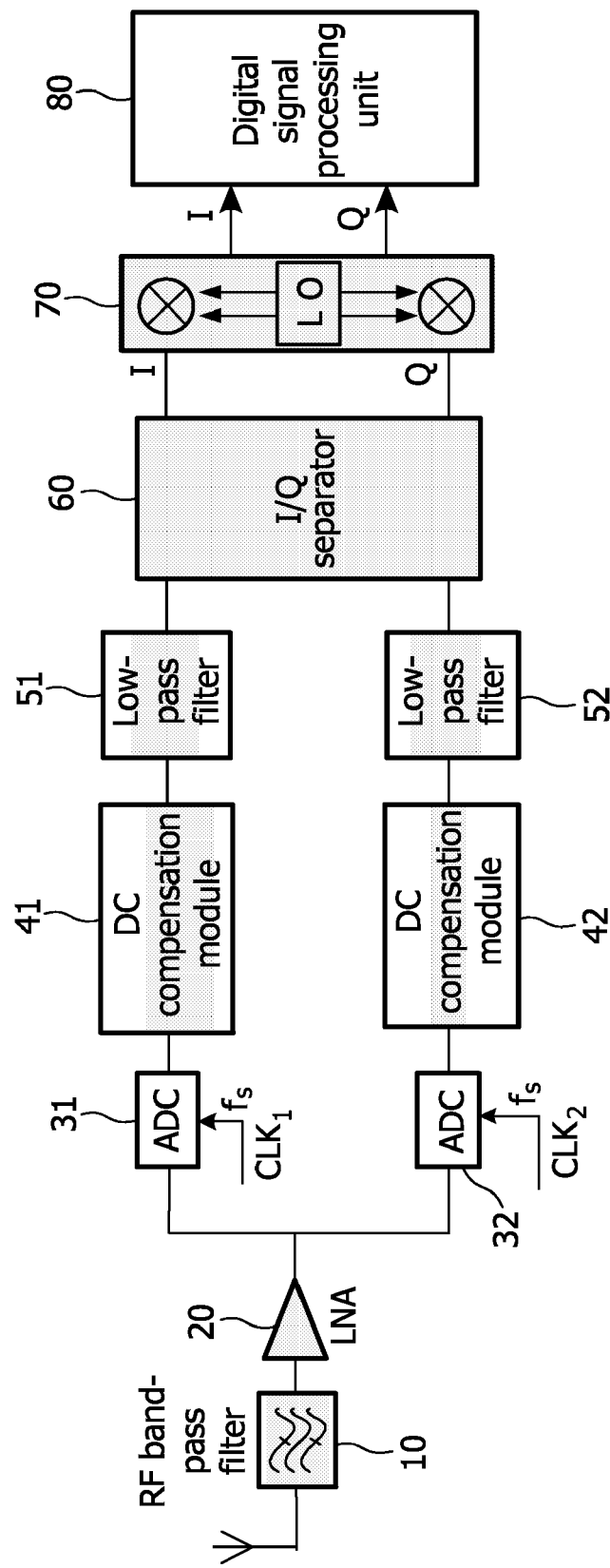
FIG. 7 is an architectural figure of one embodiment of the low intermediate frequency receiver of the present invention.

According to the aforementioned sampling method, an architectural figure of one embodiment of the low intermediate frequency receiver of the present invention is as shown in FIG. 7. In FIG. 7, the radio frequency signals received by an antenna will first go through the filtering processing of the radio frequency band-pass filter 10 and the low-noise amplifying of LNA 20 in turn, so as to be divided into two paths of signals, which go through ADC 31 and 32 to finish the analog to digital conversion. Wherein the sampling clock frequencies of ADC 31 and 32 are both $$f_s = \frac{f_c \pm f_{IF}}{N},$$

$0 \leq f_{IF} < f_s$, and there is a fixed relative time delay $\tau$ between the sampling clocks CLK$_1$ and CLK$_2$, and $$\tau \ll \frac{1}{B},$$

wherein B is the signal band-width.

After analog to digital conversion, the two digital signal sequences go through the DC compensation modules 41 and 42, respectively, to filter out the interference of DC drift and intermodulation component, etc., in the zero frequency domain therein, wherein the DC compensation modules 41 and 42 could be high-pass filter.

After DC compensation, the two digital signal sequences go through the digital low-pass filters 51 and 52, respectively, to coarsely filter out the outband interfering signal. Then, the two paths of base band digital signal output from the digital low-pass filters 51 and 52 are delivered to I/Q separator 60 so as to separate the two orthogonal components.

Finally, the signal output from I/Q separator 60 goes through the mixing module 70 to have the center of the frequency spectrum of the useful signal shifted to the zero frequency, and then is delivered to the following-up digital signal processing unit 80 to be further filtered, demodulated and decoded, etc., to recover the desired user signal.

By using the above-mentioned low intermediate frequency receiver and the sampling method thereof according to the present invention, the interferences like DC drift and intermodulation component, etc., at the zero frequency could be easily filtered out without imposing any great influence on the useful signals. Therefore, the low intermediate frequency receiver and the sampling method thereof according to the present invention could not only be applied to communication systems like IS-95, CDMA2000 and UMTS, but also be applied to the communication system of the types of GSM and Bluetooth, etc., so they are more universal.

Those skilled in the art shall understand that various improvements could be made to the low intermediate frequency receiver and the sampling method thereof disclosed in the present invention, without departing the contents of the present invention, so the protection scope of the invention should be determined by the attached claims.

The invention claimed is:

1. A method for sampling a received radio frequency signal, the method comprising:
   sampling the radio frequency signal for converting the radio frequency signal into a digital signal of non-zero frequency domain;
   compensating the digital signal of non-zero frequency domain for filtering out interfering signals therein; and
   shifting the frequency of the compensated digital signal to a zero frequency domain,
   wherein compensating the digital signal of non-zero frequency domain for filtering out interfering signals therein comprises compensating the digital signal of non-zero frequency domain through high-pass filtering, so as to filter out interfering signals at the zero frequency domain.

2. The method according to claim 1, further comprising, performing low-pass filtering on the compensated digital signal, and providing the resulting signal to be processed.

3. The method according to claim 1, further comprising, performing I/Q separation on the compensated digital signal.

4. A low intermediate frequency receiver for receiving radio frequency signal, the receiver comprising:

an analog to digital converting unit configured to sample a radio frequency signal to convert the radio frequency signal into a digital signal of non-zero frequency domain;

a compensation module configured to compensate the digital signal of non-zero frequency domain to filter out interfering signals therein; and a mixing module configured to shift the compensated digital signal to the zero frequency domain, wherein the compensation module comprises two high-pass filters.

5. The low intermediate frequency receiver according to claim 4, further comprising a signal separator configured to perform I/Q separation on the compensated digital signal.

6. The low intermediate frequency receiver according to claim 5, further comprising filter configured to filter the signal output from the compensation module and configured to output the filtered digital signal to the signal separator.

7. A mobile terminal used in radio communication system, the mobile terminal comprising:

a receiver, comprising:
   a receiving unit configured to receive a radio frequency signal;
   an analog to digital converting unit configured to sample the radio frequency signal so as to convert the radio frequency signal into a digital signal of non-zero frequency domain;
   a compensation module configured to compensate the digital signal of non-zero frequency domain to filter out interfering signals therein; and
   a mixing module configured to shift the compensated digital signal to the zero frequency domain; and
a signal processing means for performing unit configured to perform subsequent processing on the signal output from the mixing module,
wherein the compensation module comprises two high-pass filters.

8. The mobile terminal according to claim 7, further comprising a signal separator configured to perform I/Q separation on the compensated digital signal.

9. The mobile terminal according to claim 8, further comprising a filter configured to filter the signal output from the compensating module and configured to output the filtered digital signal to the signal separator.

10. A method for sampling a received radio frequency signal, the method comprising:
sampling the radio frequency signal for converting the radio frequency signal into a digital signal of non-zero frequency domain;
compensating the digital signal of non-zero frequency domain for filtering out interfering signals therein; and
shifting the frequency of the compensated digital signal to a zero frequency domain,
wherein sampling the radio frequency signal for converting the radio frequency signal into a digital signal of non-zero frequency domain comprises converting the radio frequency signal into two paths of digital signals of non-zero frequency domain under control of two sampling clock signals respectively.

11. The method according to claim 10, wherein the frequencies $f_s$ of the two sampling clock signals equal $(f_c+f_{IF})/N$ and $(f_c-f_{IF})/N$ respectively, wherein N is a natural number, $f_c$ is the frequency of the radio frequency signal, $f_{IF}$ is an intermediate frequency value and $0 \leq f_{IF} < f_s$.

12. The method according to claim 11, wherein there is a relative time delay τ between the two sampling clock signals, τ satisfies the formula $\phi_2-\phi_1=Nf_s\tau \neq n\pi$, and wherein φ1 and φ2 are the initial phases of the radio frequency signals with respect to the two sampling clock signals respectively, and n is a natural number.

13. The method according to claim 12, wherein the relative time delay τ satisfies the formula $$Nf_s\tau = \left(n+\frac{1}{2}\right)\pi.$$

14. A low intermediate frequency receiver for receiving radio frequency signal, the receiver comprising:
an analog to digital converting unit configured to sample a radio frequency signal to convert the radio frequency signal into a digital signal of non-zero frequency domain;
a compensation module configured to compensate the digital signal of non-zero frequency domain to filter out interfering signals therein; and
a mixing module configured to shift the compensated digital signal to the zero frequency domain,
wherein the analog to digital converting unit comprises a first analog to digital converter and a second analog to digital converter, the first analog to digital converter and second analog to digital converter are respectively used for converting the radio frequency signal into two paths of digital signals of non-zero frequency domain under control of two sampling clock signals.

15. The low intermediate frequency receiver according to claim 14, wherein the frequencies $f_s$ of the two sampling clock signals equal $(f_c+f_{IF})/N$ and $(f_c-f_{IF})/N$ respectively, wherein N is a natural number, $f_c$ is the frequency of the radio frequency signal, $f_{IF}$ is an intermediate frequency value and $0 \leq f_{IF} < f_s$.

16. The low intermediate frequency receiver according to claim 15, wherein there is a relative time delay τ between the two sampling clock signals, τ satisfies the formula $\phi_2-\phi_1=Nf_s\tau \neq n\pi$, and wherein φ1 and φ2 are the initial phases of the radio frequency signals with respect to the two sampling clock signals respectively, and n is a natural number.

17. The low intermediate frequency receiver according to claim 16, wherein the relative time delay τ satisfies the formula $$Nf_s\tau = \left(n+\frac{1}{2}\right)\pi.$$

18. A mobile terminal used in radio communication system, the mobile terminal comprising:
a receiver, comprising:
   a receiving unit configured to receive a radio frequency signal;
   an analog to digital converting unit configured to sample the radio frequency signal so as to convert the radio frequency signal into a digital signal of non-zero frequency domain;
   a compensation module configured to compensate the digital signal of non-zero frequency domain to filter out interfering signals therein; and
   a mixing module configured to shift the compensated digital signal to the zero frequency domain; and
a signal processing means for performing unit configured to perform subsequent processing on the signal output from the mixing module, wherein the analog to digital converting unit comprises a first analog to digital converter and a second analog to digital converter, the first analog to digital converter and second analog to digital converter are respectively used for converting the radio frequency signal into two paths of digital signals of non-zero frequency domain under control of two sampling clock signals.

19. The mobile terminal according to claim 18, wherein the frequencies $f_s$ of the two sampling clock signals are $(f_c+f_{IF})/N$ and $(f_c-f_{IF})/N$ respectively, wherein N is a natural number, $f_c$ is the frequency of the radio frequency signal, $f_{IF}$ is an intermediate frequency value and $0 \leq f_{IF} < f_s$.

20. The mobile terminal according to claim 19, wherein there is a relative time delay ti between the two sampling clock signals, $\tau$ satisfies the formula $\phi_2-\phi_1=Nf_s\tau \neq n\pi$, and wherein $\phi 1$ and $\phi 2$ are the initial phases of the radio frequency signals with respect to the two sampling clock signals respectively, and n is a natural number.

* * * * *